US006581185B1

(12) United States Patent
Hughes (10) Patent No.: US 6,581,185 B1
(45) Date of Patent: Jun. 17, 2003

(54) APPARATUS AND METHOD FOR RECONSTRUCTING DATA USING CROSS-PARITY STRIPES ON STORAGE MEDIA

(75) Inventor: James Prescott Hughes, Lino Lakes, MN (US)

(73) Assignee: Storage Technology Corporation, Louisville, CO (US)

( * ) Notice: Subject to any disclaimer, the term of this patent is extended or adjusted under 35 U.S.C. 154(b) by 0 days.

(21) Appl. No.: 09/490,258

(22) Filed: Jan. 24, 2000

(51) Int. Cl.[7] .......................... G06F 11/00; G06F 12/00
(52) U.S. Cl. ........................ 714/804; 711/114
(58) Field of Search ................. 714/701, 702, 714/804, 723, 766, 711, 770; 711/114

(56) References Cited

U.S. PATENT DOCUMENTS

| | | | | |
|---|---|---|---|---|
| 4,201,976 A | | 5/1980 | Patel | 371/50 |
| 5,351,246 A | * | 9/1994 | Blaum et al. | 714/6 |
| 5,537,567 A | | 7/1996 | Galbraith et al. | |
| 5,579,475 A | | 11/1996 | Blaum et al. | |
| 5,623,595 A | | 4/1997 | Bailey | |
| 5,805,788 A | * | 9/1998 | Johnson | 711/114 |
| 5,812,753 A | * | 9/1998 | Chiariotti | 714/54 |
| 5,862,158 A | * | 1/1999 | Baylor et al. | 714/6 |
| 5,884,098 A | * | 3/1999 | Mason, Jr. | 710/1 |
| 6,092,215 A | * | 7/2000 | Hodges et al. | 711/114 |
| 6,138,201 A | * | 10/2000 | Rebalski | 711/111 |
| 6,223,300 B1 | * | 4/2001 | Gotoh | 711/114 |

FOREIGN PATENT DOCUMENTS

WO    99 17217    4/1999

OTHER PUBLICATIONS

Tape group parity protection Johnson, T.; Prabhakar, S. Mass Storage Systems, 1999. 16th IEEE Symposium on , 1999 pp.: 72–79.*
On variable scope of parity protection in disk arrays by Franaszek, P.A.; Robinson, J.T. Computers, IEEE Transactions on , vol.: 46 Issue: 2 , Feb. 1997 pp.: 234–240.*
Redundant optical storage using DVD–RAM library—Tanabe et al. NTT Integrated Inf. & Energy Syst. Labs., Tokyo, Japan: Mass Storage Systems, 1999. 16th IEEE Symposium on, On pp.: 80–87 Mar. 15–18, 1999 San Diego, CA, USA.*
Patel; Adaptive Cross–Parity (AXP) Code For a High–Density Magnetic Tape System; IBM J. Res. Develop.; Vol 29, No 6, Nov. 1985; pp 546–526.

* cited by examiner

Primary Examiner—Phung M. Chung
Assistant Examiner—Cynthia Britt
(74) Attorney, Agent, or Firm—Carstens, Yee & Cahoon, L.L.P.

(57) ABSTRACT

An apparatus and method for reconstructing missing data using cross-parity stripes on a storage medium is provided. The apparatus and method may operate on data symbols having sizes greater than a data bit. The apparatus and method makes use of a plurality of parity stripes for reconstructing missing data stripes. The parity symbol values in the parity stripes are used as a basis for determining the value of the missing data symbol in a data stripe. A correction matrix is shifted along the data stripes, correcting missing data symbols as it is shifted. The correction is performed from the outside data stripes towards the inner data stripes to thereby use previously reconstructed data symbols to reconstruct other missing data symbols.

28 Claims, 6 Drawing Sheets

APPARATUS AND METHOD FOR RECONSTRUCTING DATA USING CROSS-PARITY STRIPES ON STORAGE MEDIA

BACKGROUND OF THE INVENTION

1. Technical Field

The present invention is directed to an apparatus and method for reconstructing missing data using cross-parity stripes on storage media. Specifically, the invention is directed to the use of a plurality of cross-parity stripes on storage media to correct for errors in reading the data on the storage media.

2. Description of Related Art

The use of parity stripes to correct up to three read errors on magnetic tape is generally known in the art. For example, U.S. Pat. No. 4,201,976 issued to Arvind M. Patel, and the article by the same author entitled "Adaptive cross-parity (AXP) Code for a High-Density Magnetic Tape Subsystem," IBM J. Res. Develop., vol. 29, no. 6, November 1985, describe a method for using vertical and cross parity stripes to correct data bits on a single magnetic tape for up to three stripe read errors. These documents are hereby incorporated by reference.

Additionally, it is generally known to use redundant array of independent tape (RAIT) systems. RAIT systems use a plurality of tape drives to improve the performance and reliability of the storage medium. Data may be striped across many tape drives to increase performance. However, the drawback is that any tape error renders the complete stripe group unreadable.

Thus, it would be advantageous to develop an apparatus and method that is capable of correcting for more than three stripe read errors when reading data from a storage medium. Furthermore, it would be advantageous to develop an apparatus and method for correcting more than three stripe read errors when reading data from a RAIT system.

SUMMARY OF THE INVENTION

The present invention provides an apparatus and method for reconstructing missing data using cross-parity stripes on a storage medium. The apparatus and method may operate on data symbols having sizes greater than a data bit, such as may be used in a RAIT system.

The apparatus and method makes use of a plurality of parity stripes for reconstructing missing data stripes. The parity symbol values in the parity stripes are used as a basis for determining the value of the missing data symbol in a data stripe.

With the apparatus and method of the present invention, a correction matrix is shifted along the data stripes, correcting missing data symbols as it is shifted. The correction is performed from the outer most data stripes towards the inner data stripes to thereby use previously reconstructed data symbols to reconstruct other missing data symbols.

Thus, with the present invention data is reconstructed by organizing the received parity stripes in order. The smallest slope diagonal lines of the correction matrix, representing the linear equations of the parity symbols, may be used to correct the top and bottom most missing data stripes as deep as is necessary. Once the top and bottom most data stripes are corrected, the next largest slope lines may be used to correct the next inner missing data stripe and so forth until all the missing data stripes are corrected.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein like numerals designate like elements, and wherein:

DETAILED DESCRIPTION OF THE PREFERRED EMBODIMENT

Figure 1:
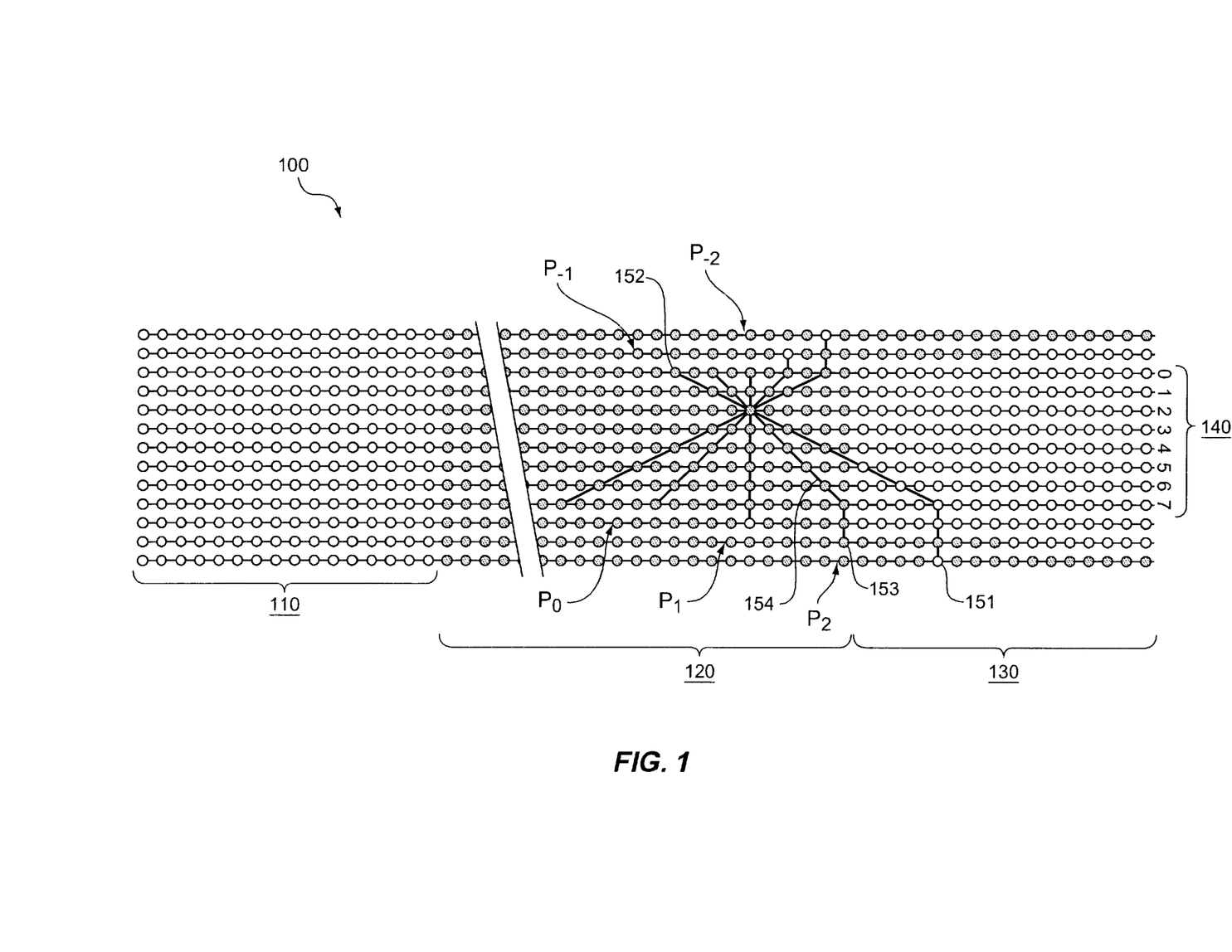
FIG. 1 is an exemplary diagram of a virtual magnetic tape volume for illustrating the present invention.

FIG. 1 is an exemplary diagram of a virtual tape volume 100 of a RAIT system. The virtual tape volume 100 of FIG. 1 may be distributed over a plurality of physical tape drives. As shown in FIG. 1, the tape volume includes a preface section 110, a data stripe section 120, a suffix section 130 and a plurality of data stripes 140.

While the present invention will be described with reference to the use of magnetic tape medium and a virtual tape volume, it should be understood by those of ordinary skill in the art that the invention is not limited to such an exemplary embodiment. Rather, the invention is applicable to any storage medium that may make use of parity information for reconstruction of missing data. For example, the invention may be implemented with magnetic disks, optical disks, magnetic tape, holographic storage medium, and the like. For purposes of explanation, however, the invention will be described with reference to magnetic tape medium and a RAIT system.

The data is striped over n data stripes having a length of l symbols. A symbol length s may be defined in terms of bits of data, bytes of data or any data word length. In the exemplary embodiment shown in FIG. 1, the symbol length s is assumed to be 32 bits, although any length symbol, such as 8, 16, 32 or 64 bits, may be used without departing from the spirit and scope of the present invention.

A plurality of parity stripes, designated by the identifiers $p_x$, are created and the resulting n+p stripes are distributed over the physical tape drives. The parity symbols of a parity stripe are independent linear equations of the data symbols which may be corrected using the parity symbol. Thus, for example, the parity symbol 151 may be used to correct an error in reading any of the data symbols along line 152. Line 152 corresponds to the linear equation of parity symbol 151.

The parity stripes are thus, identified by the slope of the linear equation of the parity symbols in the parity stripe. The slope of the linear equation may be identified as rise:run. If the slope is considered to be $-1{:}x$, the x value may be used to designate the slope of the linear equation of a parity stripe. Thus, for example, the slope of line 152 is $-1{:}2$, and hence, the parity stripe for the parity symbol 151 is designated $p_2$. The same is true for each parity stripe, such that the parity stripe for parity symbol 153 is $p_1$ (the slope of line 154 is $-1{:}1$).

The parity stripes $p_x$ are created with the assumption that there is a sufficiently large preface 110 of zero value symbols before the data stripe 120 and a sufficiently large suffix 130 of zero value symbols after the data stripe. The size of the preface 110 and the suffix 130 may be, for example, equal to the number of data stripes times the number of parity stripes. Thus, for example, the size of the preface 110 and the suffix 130 for 8 data stripes and 5 parity stripes may be 40 symbols in length.

The preface 110 and suffix 130 may not actually have zero value symbols in the data stripes 140 but may be assumed to have zero values for purposes of reconstructing data lost due to stripe read errors. The preface 110 is used to provide a known starting point of correct data.

Parity symbols that do not contain any information from data stripes do not need to be stored. Thus, parity stripes for $p_0$ are l symbols long, parity stripes for $p_1$ are l+n symbols long, $p_2$ parity stripes are l+2n symbols long, and so on. Thus, for the exemplary embodiment shown in FIG. 1, the length of parity stripe $p_2$ is l+16 symbols.

The lengthening of the parity stripes is not a significant performance factor for RAIT systems. Assuming a 65536 symbol data stripe size, n=8, p=5 and s=32, the length of the two longest parity stripes is 65,600, or an increase of less than one tenth of one percent. Thus, the lengthening of the parity stripes does not have a significant negative affect on RAIT systems.

When a stripe read error occurs during the reading of data from a virtual tape volume, such as that shown in FIG. 1, data is lost and must be reconstructed. For example, when a stripe read error occurs, an entire burst, i.e. an entire data stripe, is zeroed out. This is known as burst erasure channel.

With the present invention, data is reconstructed by organizing the received parity stripes in order. The smallest slope diagonal lines (largest abs(x)), representing the linear equations of the parity symbols, may be used to correct the top and bottom most missing data stripes as deep as is necessary. Once the top and bottom most data stripes are corrected, the next largest slope lines (abs(x)−1) may be used to correct the next inner missing data stripe and so forth until all the missing stripes are corrected.

Figure 2:
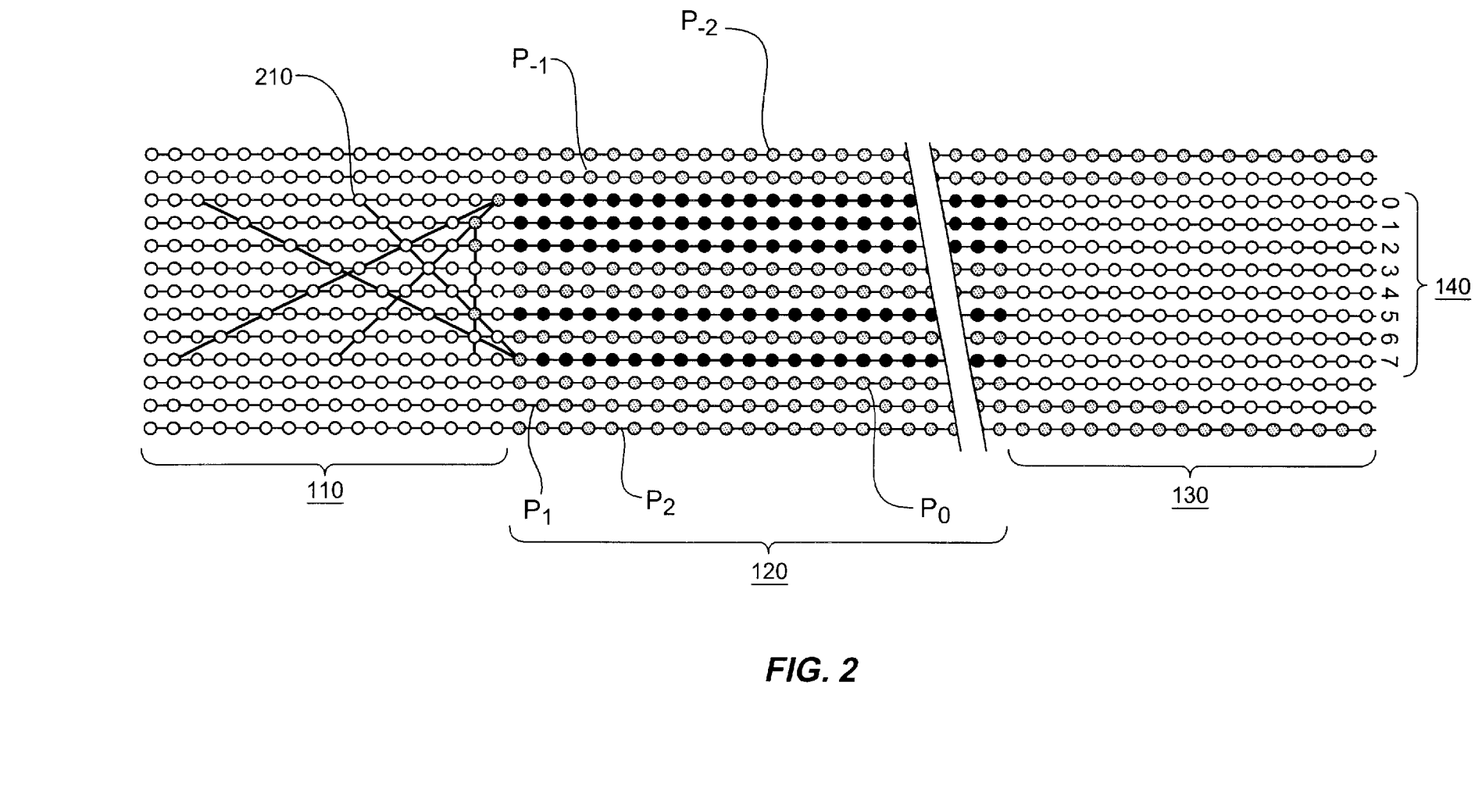
FIG. 2 is an exemplary diagram illustrating the use of a correction matrix and parity stripes to correct missing data stripes.
Figure 3:
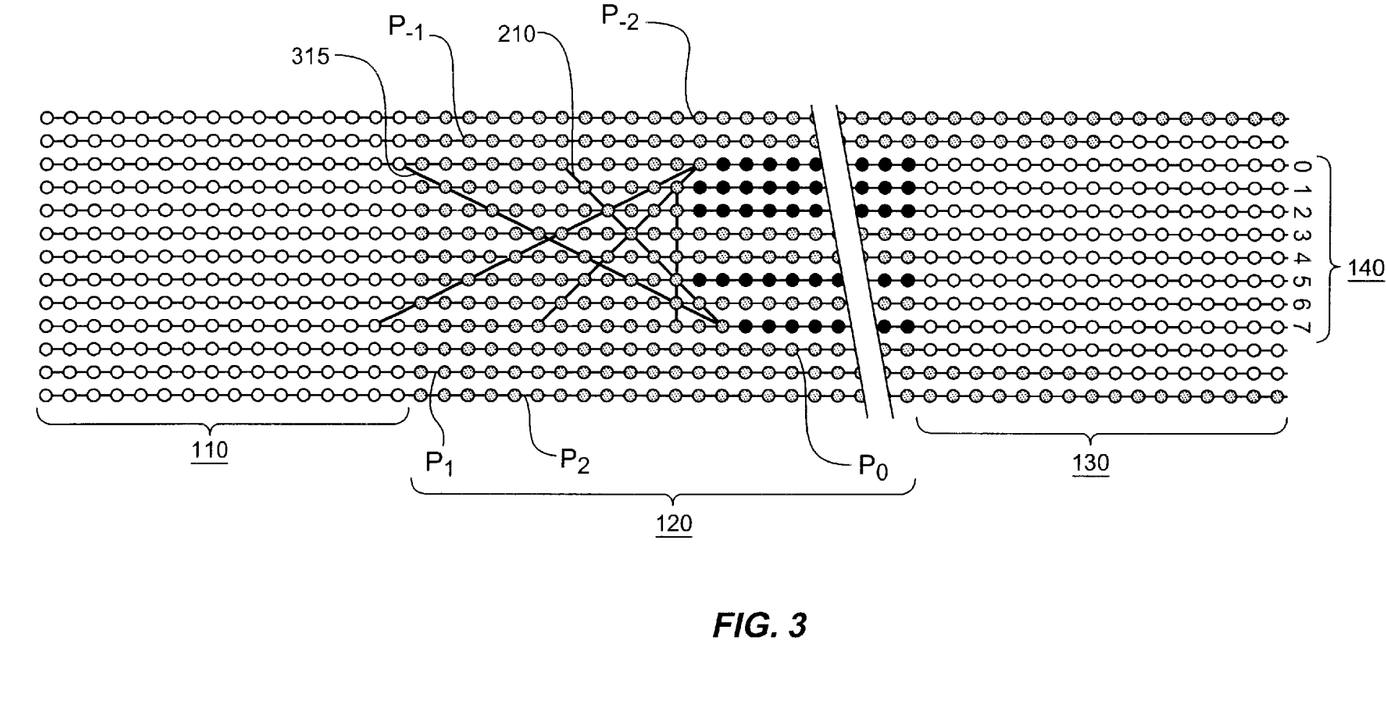
FIG. 3 is an exemplary diagram illustrating the virtual magnetic tape volume of FIG. 2 at a later time in the data stripe correction process.

FIGS. 2 and 3 illustrate how the parity stripes may be used to correct missing data stripes. FIG. 2 shows an initial starting position for the reconstruction of missing data stripes. The black dots represent missing data symbols, the white dots represent known zeroes, and the gray dots represent known data symbols. Thus, as shown in FIG. 2, the data symbols of data stripes 0, 1, 2, 5 and 7 have been burst erased due to a stripe read error in reading the data from the virtual tape volume. With prior art devices, such an error would make the entire stripe group unreadable.

As shown in FIG. 2, the present invention may reconstruct the missing data by using, for example, 5 parity stripes having the correction matrix 210. The reconstruction is performed from the outside in. For example, the symbol in data stripe 0 is corrected by parity stripe $p_{-2}$, then the symbol in data stripe 1 is corrected by parity stripe $p_{-1}$, the symbol in data stripe 7 is then corrected by parity stripe $p_2$, the symbol in data stripe 5 is corrected by parity stripe $p_1$, and the symbol in data stripe 2 is corrected by parity stripe $p_0$.

Once all of the symbols for the missing data stripes have been reconstructed, the correction matrix 210 is shifted one position to the right and the process is repeated. FIG. 3 shows the correction matrix 210 at a later point in time in the data reconstruction process. As shown in FIG. 3, all of the data symbols for the missing data stripes which are within the correction matrix 210 have been corrected. The remaining missing data symbols of the missing data stripes to the right of the correction matrix 210 will be corrected as the correction matrix 210 is shifted to the right through the data stripe section 120 and into the suffix 130.

The reconstruction may be thought of as a system of two equations having one unknown variable. Assume that the symbols along line 310 in FIG. 3, for example, have the following values 0, 2, 4, 10, 15, 20, 24 and that data symbol 315 must be reconstructed. Since we know the value of the linear equation represented by the line 310, i.e. the parity symbol value, we can solve the system of equations for the unknown variable. Thus, for example, if the value of the parity symbol is 85, the system of equations becomes:

$$0+2+4+10+15+20+24+X=85 \quad (1)$$

$$0+2+4+10+15+20+24=75 \quad (2)$$

Thus, by subtracting equation (2) from equation (1), the system of equations may be solved for X which gives a value of 10. Therefore, the value of the missing data symbol is 10. Accordingly, the data symbol for data stripe 5 may be reconstructed to have the value 10.

In actuality, the values of the data symbols are 32 bit data values and the "+" symbols in the above equation are exclusive OR operations. However, the underlying concept described above is still applicable.

Figure 4:
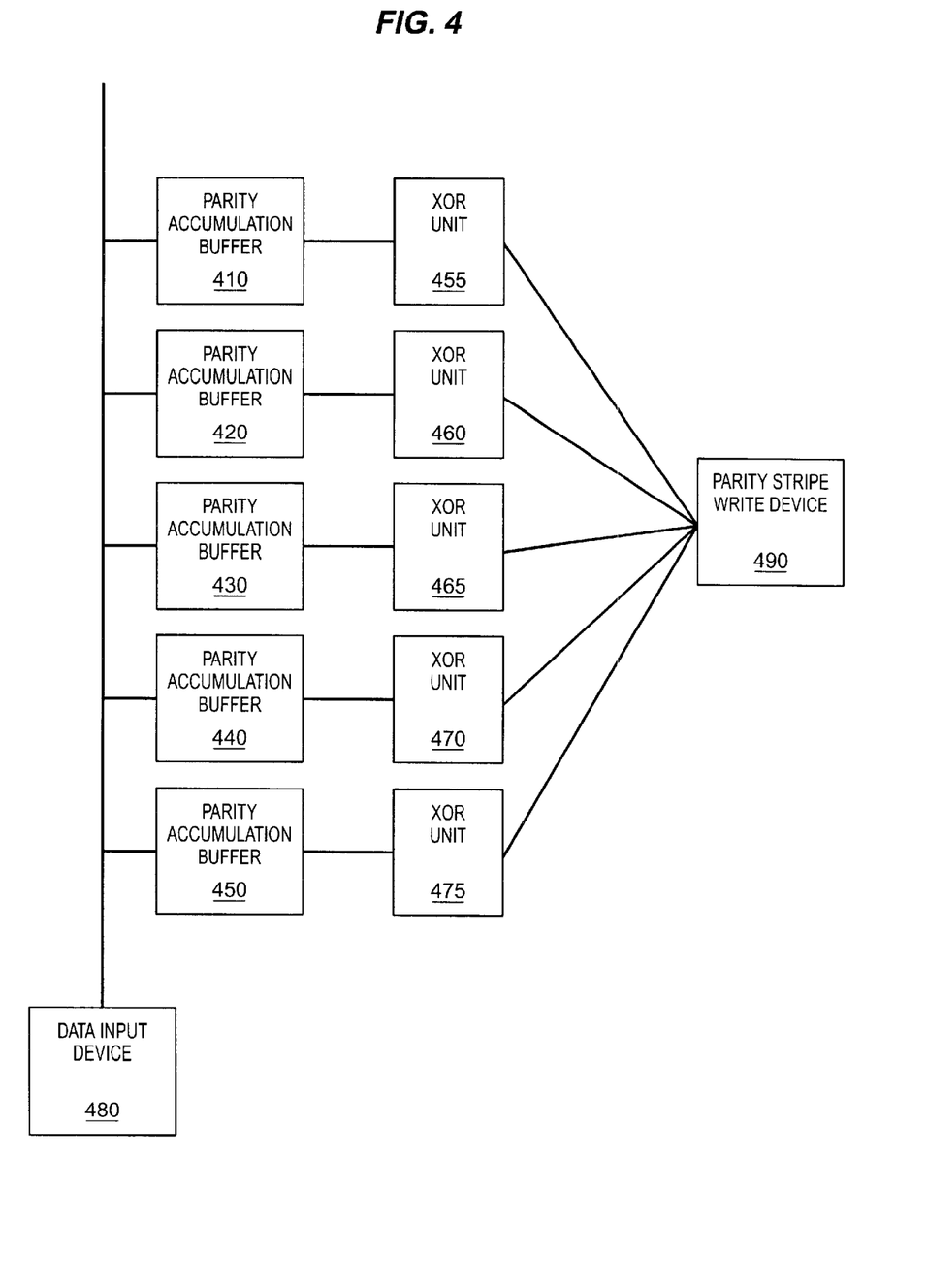
FIG. 4 is an exemplary diagram of a hardware implementation for generating the parity stripes.

FIG. 4 is an exemplary diagram of a hardware configuration for parity stripe generation according to the present invention. As shown in FIG. 4, the hardware configuration includes a plurality of parity accumulation buffers 410–450 and a plurality of associated XOR units 455–475. A parity accumulation buffer and an XOR unit is provided for each parity stripe and is dedicated to the respective parity stripe.

As data is read in by the data input device 480, an offset into each parity accumulation buffer 410–450 is set. As the data is clocked in, the XOR units 455–475 process the data s bits at a time. The resulting parity symbol value for the respective parity stripes is then output to the parity stripe write device 490 for writing the parity stripes on the magnetic tape medium.

Alternatively, the Xilinx Vertex V800 associated with the StorageNet 6000 may be used to implement this invention. The Xilinx Vertex V800 has 800 kilobytes free gates and an additional amount of RAM logic that may be used to implement this invention. With the Xilinx Vertex V800 operating on 32 bit symbols at 25 Mhz, all p parity stripes may be calculated at 100 megabytes per second.

Figure 5:
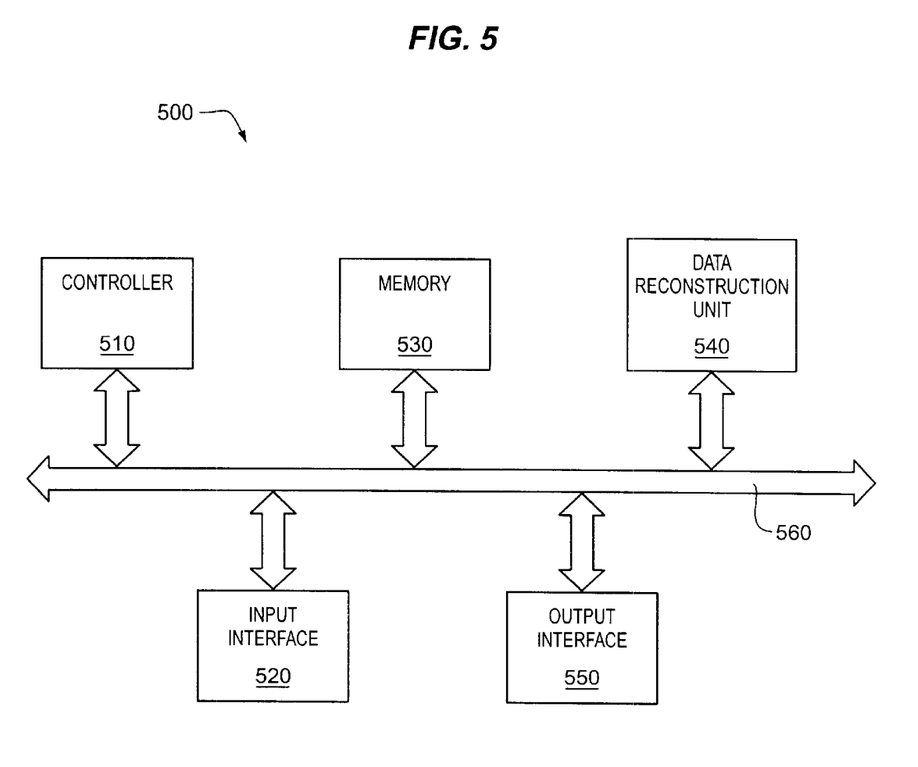
FIG. 5 is an exemplary block diagram of a data reconstruction apparatus according to the present invention.

FIG. 5 is an exemplary block diagram of a data reconstruction apparatus 500 according to the present invention. As shown in FIG. 5, the data reconstruction apparatus includes a controller 510, an input interface 520, a memory 530, a data reconstruction unit 540, and an output interface 550. These devices are in communication with one another by way of control/signal bus 560. Although a bus architecture is shown in FIG. 5, it should be appreciated that any other type of architecture that facilitates communication among the elements 510–550 may be used without departing from the spirit and scope of the invention.

As data is read in by a magnetic tape reading device (not shown), the data is supplied to the data reconstruction apparatus 500 via the input interface 520 and is temporarily stored in the memory 530. The controller 510 monitors the data input via the input interface 520 to determine if any of the data from the magnetic tape is missing or otherwise unreadable. If any of the data is determined to be missing, the controller 510 instructs the data reconstruction unit 540 to reconstruct the missing data using the data stored in memory 530. The reconstructed data is then output via the output interface 550 for use by a data processing system.

Figure 6:
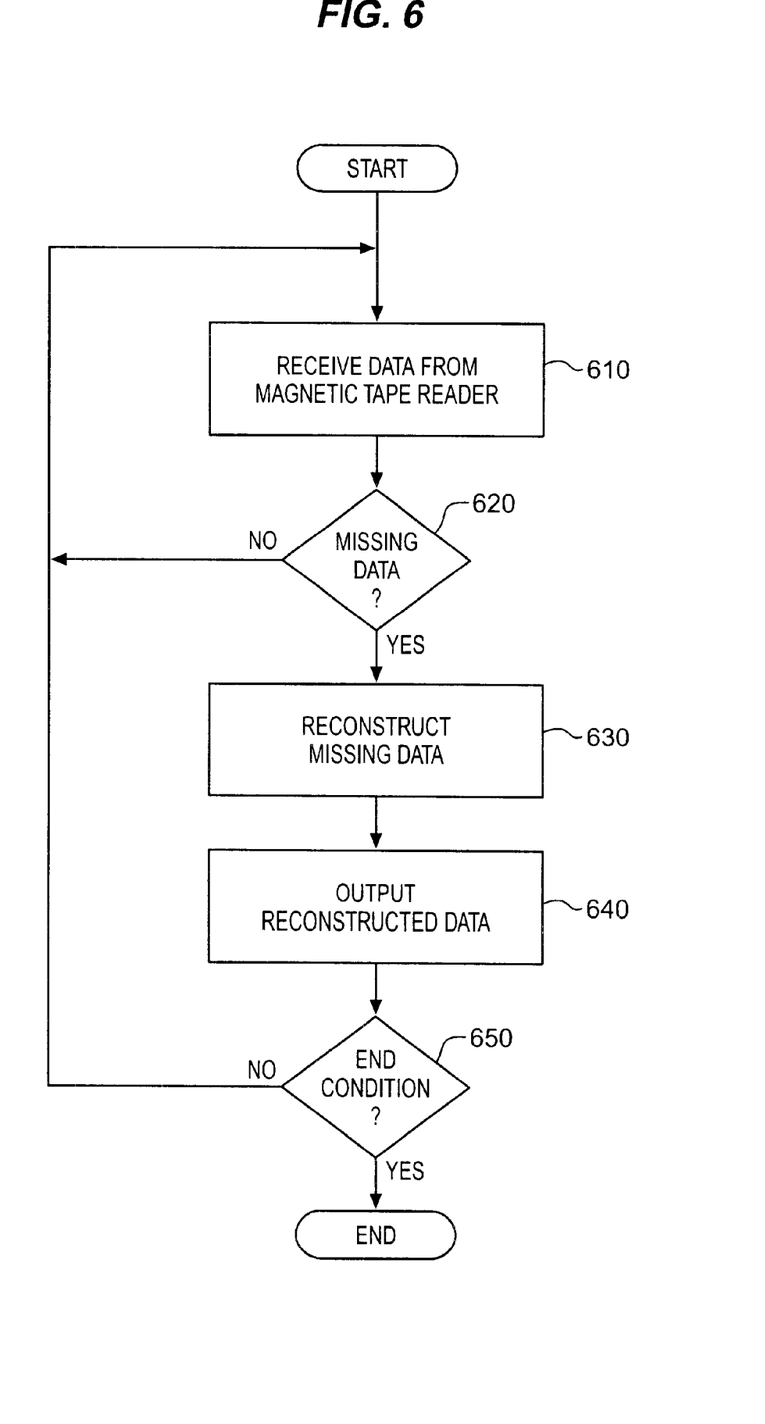
FIG. 6 is a flowchart outlining an exemplary operation of the data reconstruction apparatus of FIG. 5.

FIG. 6 is a flowchart outlining an exemplary operation of the data reconstruction apparatus 500. As shown in FIG. 6, the operation starts with the controller receiving data input from a magnetic tape reader (step 610). The controller 510 monitors the input data to determine if there is any missing data (step 620). If not, the controller 510 continues to monitor the input data for missing data. If there is missing data, the controller 510 instructs the data reconstruction unit 540 to reconstruct the missing data using the method described above (step 630). The reconstructed data is then output for use by a data processing apparatus (step 640). The operation may then be repeated until an end condition, such as a termination of the reading of the magnetic tape, is encountered (step 650).

While the present invention has been described with reference to the use of 5 parity stripes and 8 data stripes, the invention is not limited to such an implementation. Rather, the invention facilitates the use of any number of parity stripes and data stripes. With an increase in parity stripes, the number of lines in the correction matrix 210 should be increased with each line having a different slope.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of reconstructing missing data when reading data from a storage medium, comprising:
   reading parity symbol values from a plurality of parity stripes on the storage medium;
   determining, for each parity symbol, a total data value for known data symbols along a line associated with a parity stripe within the plurality of parity stripes;
   calculating a value for any missing data from the parity symbol value and the total data value; and
   using a correction matrix to reconstruct the missing data, wherein the correction matrix has a plurality of lines of different slope that are used to reconstruct missing data in data stripes, and wherein the missing data of the data stripes is reconstructed in an order based on an ordering of slopes of the lines of the correction matrix.

2. The method of claim 1, wherein the parity symbol values and the data symbols have a data size of at least two bits.

3. The method of claim 1, wherein each line within the plurality of lines is associated with a parity shape.

4. The method of claim 1, wherein a line of the correction matrix having a smallest slope is used to reconstruct missing data in an outer most data stripe.

5. The method of claim 4, wherein, once missing data in the outer most data stripe is reconstructed, a line of the correction matrix having a next larger slope than the smallest slope line is used to reconstruct missing data in a next inner data stripe.

6. The method of claim 1, wherein the plurality of parity stripes includes at least four cross-parity stripes.

7. A storage medium, comprising:
   a plurality of data stripes, the data stripes being comprised of a plurality of data symbols;
   at least three cross-parity stripes, the cross parity stripes being comprised of a plurality of parity symbols, wherein the parity symbols of the cross-parity stripes are used to reconstruct missing data symbols when the data stripes are read; and
   a preface section and suffix section, wherein the data symbols in the preface section and suffix section are assumed to be zero.

8. The storage medium claim 7, wherein the data symbols and the parity symbols have a data size of at least two bits.

9. The storage medium of claim 7, wherein sizes of the preface section and the suffix section are each equal to a number of the plurality of data stripes multiplied by a number of the plurality of parity stripes.

10. The storage medium of claim 7, wherein a length of the parity stripes is equal to a sum of a length of the plurality of data stripes and a multiple of the number of the plurality of data stripes.

11. The storage medium of claim 7, wherein each parity symbol of the plurality of parity symbols is a resulting value obtained from an exclusive OR operation applied to each of the data symbols in a line traversing the plurality of data stripes, the line being associated with a parity stripe in which the parity symbol is located.

12. A redundant array of independent tapes (RAIT) system having a set of tape drives, comprising:
   a plurality of data stripes, the data stripes being comprised of a plurality of data symbols;
   a set of parity stripes, the set of parity stripes being comprised of a plurality of parity symbols, wherein the plurality of data stripes and the set of parity stripes are distributed over the set of tape drives of the RAIT system, and wherein the parity symbols of the set of parity stripes are used to reconstruct data symbols that are not read when the data stripes are read; and
   a preface section and a suffix section, wherein data symbols in the preface section and the suffix section are assumed to be zero.

13. The RAIT system of claim 12, wherein the data symbols and the parity symbols have a data size of two or more bits.

14. The RAIT system of claim 12, wherein sizes of the preface section and the suffix section are each equal to a number of the plurality of data stripes multiplied by a number of the set of parity stripes.

15. The RAIT system of claim 12, wherein a length of the set of parity stripes is equal to a sum of a length of the plurality of data stripes and a multiple of the number of the plurality of data stripes.

16. The RAIT system of claim 12, wherein each parity symbol of the plurality of parity symbols is a resulting value obtained from an exclusive OR operation applied to each of the data symbols in a line traversing the plurality of data stripes, the line being associated with a parity stripe in the set of parity stripes in which the parity symbol is located.

17. A method of reconstructing data lost due to a stripe read error when reading a storage medium, comprising:

reading data symbols from a plurality of data stripes of the storage medium, the data symbols having missing data symbols;

reading parity symbols from a plurality parity stripes; and using the parity symbols and data symbols along with a correction matrix to reconstruct the missing data symbols, wherein the correction matrix has a plurality of lines of different slope that are used to reconstruct missing data in data stripes, and wherein the missing data of the data stripes is reconstructed in an order based on an ordering of slopes of the lines of the correction matrix.

18. The method of claim 17, wherein the data symbols and the parity symbols have a size of one of a byte of data or a data word.

19. The method of claim 17, wherein each line is associated with a parity stripe of the plurality of parity stripes.

20. The method of claim 17, wherein a line of the correction matrix having a smallest slope is used to reconstruct missing data in an outer most data stripe of the plurality of data stripes.

21. The method of claim 20, wherein, once missing data in the outer most data stripe is reconstructed, a line of the correction matrix having a next larger slope than the smallest slope line is used to reconstruct missing data in a next inner data stripe of the plurality of data stripes.

22. The method of claim 17, wherein the plurality of parity stripes includes at least four cross-parity stripes.

23. A data reconstruction apparatus, comprising:

a controller;

a data input interface; and a data reconstruction unit, wherein data is read from a plurality of data stripes on a medium and input to the controller via the data input interface, the controller determines if the data input to the controller indicates that there is missing data, if missing data is present, the controller instructs the data reconstruction unit to reconstruct the missing data, and wherein the data reconstruction unit uses a correction matrix to reconstruct the missing data, wherein the correction matrix has a plurality of lines of different slope that are used to reconstruct missing data in the plurality of data stripes, and wherein the missing data of the plurality of data stripe is reconstructed in an order based on an ordering of slopes of the lines of the correction matrix.

24. The reconstruction apparatus of claim 23, wherein the data reconstruction unit reads parity data from a plurality of parity stripes and uses other parity data, the data input into the controller, and a correction matrix to reconstruct the missing data.

25. The data reconstruction apparatus of claim 24, wherein each line is associated with a parity stripe of the plurality of parity stripes.

26. The method of claim 24, wherein the plurality of parity stripes includes at least four cross-parity stripes.

27. The data reconstruction apparatus of claim 23, wherein a line of the correction matrix having a smallest slope is used to reconstruct missing data in an outer most data stripe of the plurality of data stripes.

28. The data reconstruction apparatus of claim 27, wherein, once missing data in the outer most data stripe is reconstructed, a line of the correction matrix having a next larger slope than the smallest slope line is used to reconstruct missing data in a next inner data stripe of the plurality of data stripes.

* * * * *